US009368751B2

(12) United States Patent
Heo et al.

(10) Patent No.: US 9,368,751 B2
(45) Date of Patent: Jun. 14, 2016

(54) ORGANIC LIGHT EMITTING DISPLAY APPARATUS AND METHOD OF MANUFACTURING THE SAME

(75) Inventors: Seong-Kweon Heo, Yongin (KR); Ki-Nyeng Kang, Yongin (KR); Jong-Hyun Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 13/416,108

(22) Filed: Mar. 9, 2012

(65) Prior Publication Data

US 2013/0056735 A1 Mar. 7, 2013

(30) Foreign Application Priority Data

Sep. 2, 2011 (KR) .................. 10-2011-0089208

(51) Int. Cl.
*H01L 51/52* (2006.01)
*H01L 27/12* (2006.01)
*H01L 29/49* (2006.01)
*H01L 27/32* (2006.01)

(52) U.S. Cl.
CPC ........ *H01L 51/5259* (2013.01); *H01L 27/1255* (2013.01); *H01L 27/3258* (2013.01); *H01L 29/4908* (2013.01); *H01L 51/5246* (2013.01); *H01L 27/3246* (2013.01)

(58) Field of Classification Search
CPC ............ H01L 51/5246; H01L 51/5259; H01L 27/3258; H01L 27/3246
USPC .......................................................... 257/40
See application file for complete search history.

(56) References Cited

U.S. PATENT DOCUMENTS

| 4,515,874 | A * | 5/1985 | Steinleitner ................... 429/104 |
| 6,605,826 | B2 * | 8/2003 | Yamazaki ............... H01L 27/32 257/359 |
| 6,958,252 | B2 | 10/2005 | Kim |
| 8,581,237 | B2 * | 11/2013 | Ushikubo .............. C09K 11/06 257/40 |
| 8,617,725 | B2 * | 12/2013 | Ushikubo .............. C09K 11/06 257/40 |

(Continued)

FOREIGN PATENT DOCUMENTS

| JP | 2008-270118 | 11/2008 |
| KR | 10-0495702 | 6/2005 |

(Continued)

OTHER PUBLICATIONS

Machine translation, TIPO Office Action, Google Translate (May 5, 2016), all pages.*

(Continued)

*Primary Examiner* — Victoria K Hall
(74) *Attorney, Agent, or Firm* — Lee & Morse, P.C.

(57) ABSTRACT

An organic light-emitting display apparatus includes a thin film transistor on a display region of a substrate, the thin film transistor facing an encapsulation member, an organic light-emitting device on the display region that includes an intermediate layer having an organic emission layer, a sealing member that is between the substrate and the encapsulation member and that surrounds the display region, an internal circuit unit between the display region and the sealing member, a passivation layer that extends to cover the internal circuit unit, a pixel defining layer on the passivation layer, and a getter between the substrate and the encapsulation member, and the getter at least partially overlapping the internal circuit unit.

24 Claims, 10 Drawing Sheets

(56) References Cited

U.S. PATENT DOCUMENTS

| | | | |
|---|---|---|---|
| 8,673,459 B2 * | 3/2014 | Seo | C07D 405/04 257/40 |
| 8,723,417 B2 * | 5/2014 | Tsuchiya | H01L 27/3244 313/483 |
| 9,190,525 B2 * | 11/2015 | Yamazaki | H01L 29/7869 |
| 2001/0002703 A1 * | 6/2001 | Koyama | G09G 3/3275 257/40 |
| 2002/0044111 A1 * | 4/2002 | Yamazaki | G09G 3/3266 345/83 |
| 2002/0070663 A1 * | 6/2002 | Ogura et al. | 313/506 |
| 2004/0195959 A1 * | 10/2004 | Park et al. | 313/500 |
| 2004/0232418 A1 * | 11/2004 | Koyama | H01L 27/3244 257/59 |
| 2005/0046346 A1 * | 3/2005 | Tsuchiya | H01L 27/3244 313/509 |
| 2005/0140265 A1 * | 6/2005 | Hirakata | 313/483 |
| 2005/0218396 A1 * | 10/2005 | Tsuchiya et al. | 257/13 |
| 2007/0187677 A1 * | 8/2007 | Park | H01L 27/3253 257/40 |
| 2007/0228380 A1 * | 10/2007 | Yoshinaga | 257/72 |
| 2008/0111125 A1 * | 5/2008 | Kim et al. | 257/40 |
| 2008/0143248 A1 | 6/2008 | Endo et al. | |
| 2008/0226902 A1 * | 9/2008 | Giannantonio et al. | 428/336 |
| 2008/0303424 A1 | 12/2008 | Mitsuya et al. | |
| 2008/0315756 A1 * | 12/2008 | Jeon et al. | 313/504 |
| 2010/0183471 A1 * | 7/2010 | Liu et al. | 419/37 |
| 2011/0079786 A1 * | 4/2011 | Kwon et al. | 257/71 |
| 2011/0127500 A1 * | 6/2011 | Ko et al. | 257/40 |
| 2011/0140107 A1 * | 6/2011 | Kang et al. | 257/57 |
| 2011/0248276 A1 * | 10/2011 | Son et al. | 257/65 |
| 2012/0024722 A1 * | 2/2012 | Chen | 206/204 |

FOREIGN PATENT DOCUMENTS

| | | |
|---|---|---|
| KR | 10-2006-0033630 A | 4/2006 |
| KR | 10-2008-0055717 | 6/2008 |
| KR | 10-2009-0099683 A | 9/2009 |
| TW | 200307893 A | 12/2003 |

OTHER PUBLICATIONS

Taiwanese Office action dated Mar. 11, 2016 for TW Patent Application No. 101111015; Seong-Kweon Heo, et al.

* cited by examiner

ORGANIC LIGHT EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2011-0089208, filed on Sep. 2, 2011, in the Korean Intellectual Property Office, the disclosure of which is incorporated herein in its entirety by reference.

BACKGROUND

Developments in display technology have led to display apparatuses with portable, thin flat panel display devices.

SUMMARY

Embodiments may be realized by providing an organic light-emitting display apparatus including a substrate that has a display region; an encapsulation member that is disposed to face the substrate; a thin film transistor that is disposed on the display region of the substrate to face the encapsulation member and includes an active layer, a gate electrode, and source and drain electrodes; an organic light-emitting device that is formed on the display region to be electrically connected to the thin film transistor and includes a first electrode, a second electrode, and an intermediate layer interposed between the first and second electrodes and including an organic emission layer; a sealing member that is disposed between the substrate and the encapsulation member to surround the display region; an internal circuit unit that is disposed between the display region and the sealing member; a passivation layer that is disposed on the thin film transistor and extends to cover the internal circuit unit; a pixel defining layer that is disposed on the passivation layer; and a getter that is disposed between the substrate and the encapsulation member to at least partially overlap with the internal circuit unit.

The passivation layer may include an inorganic material. The getter may be disposed between the substrate and the encapsulation member and between the sealing member and the display region. The getter may be formed on the passivation layer. The getter may be formed to contact with the pixel defining layer. The getter may include at least one of Ba, Ca, Mg, Ti, V, Zr, Nb, Mo, Ta, Th, Ce, Al, and Ni.

The pixel defining layer may include an organic material. The intermediate layer may be spaced apart from the passivation layer and may be in contact with the pixel defining layer. The organic light-emitting display apparatus may further include a gate insulating layer interposed between the active layer and the gate electrode, and an interlayer insulating layer formed on the gate electrode. The source and drain electrodes may be formed on the interlayer insulating layer.

The first electrode may be formed on the gate insulating layer. The interlayer insulating layer may have a stacked structure of at least two insulating layers. The interlayer insulating layer may be formed by alternately stacking an inorganic material and an organic material. The first electrode may be formed on one of a plurality of insulating layers which is not the uppermost insulating layer.

The organic light-emitting display apparatus may further include a capacitor disposed on the substrate. The capacitor may include a first capacitor electrode that is formed on the same layer as the active layer including the same material as the active layer; and a second capacitor electrode that is formed on the same layer as the gate electrode and includes a material for forming the first electrode. The second capacitor electrode may have a smaller size than the first capacitor electrode.

The first electrode may include a transmissive conductive material. The transmissive conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The first electrode may be formed by sequentially stacking the transmissive conductive materials on a semi-transmissive metal layer. The first electrode may further include a transmissive conductive material formed under the semi-transmissive metal layer. The semi-transmissive metal layer may include Ag. The intermediate layer may not overlap with the thin film transistor and may be spaced apart from the thin film transistor.

Embodiments may also be realized by providing a method of manufacturing an organic light-emitting display apparatus, the method including forming a thin film transistor that includes an active layer, a gate electrode, and source and drain electrodes on a display region of a substrate between the substrate and an encapsulation member; forming an organic light-emitting device that is disposed on the display region to be electrically connected to the thin film transistor and includes a first electrode, a second electrode, and an intermediate layer interposed between the first and second electrodes and including an organic emission layer; forming a sealing member between the substrate and the encapsulation member to surround the display region; forming an internal circuit unit between the display region and the sealing member; forming a passivation layer disposed on the thin film transistor and extending to cover the internal circuit unit; forming a pixel defining layer on the passivation layer; and forming a getter that at least partially overlaps with the internal circuit unit.

The passivation layer and the pixel defining layer may respectively have an opening corresponding to the upper surface of the first electrode. The opening of the passivation layer may be formed after forming the opening of the pixel defining layer. The opening of the passivation layer may be covered by the pixel defining layer.

BRIEF DESCRIPTION OF THE DRAWINGS

Features will become apparent to those of ordinary skill in the art by describing in detail exemplary embodiments thereof with reference to the attached drawings in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Expressions such as "at least one of," when preceding a list of elements, modify the entire list of elements and do not modify the individual elements of the list.

Figure 1:
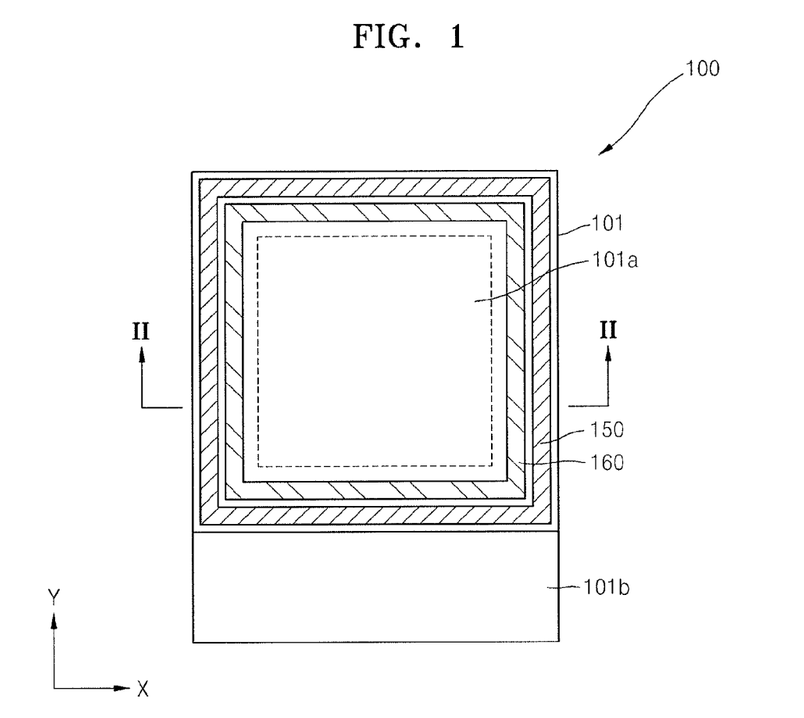
FIG. 1 illustrates a schematic plan view of an organic light-emitting display apparatus, according to an exemplary embodiment.
Figure 2:
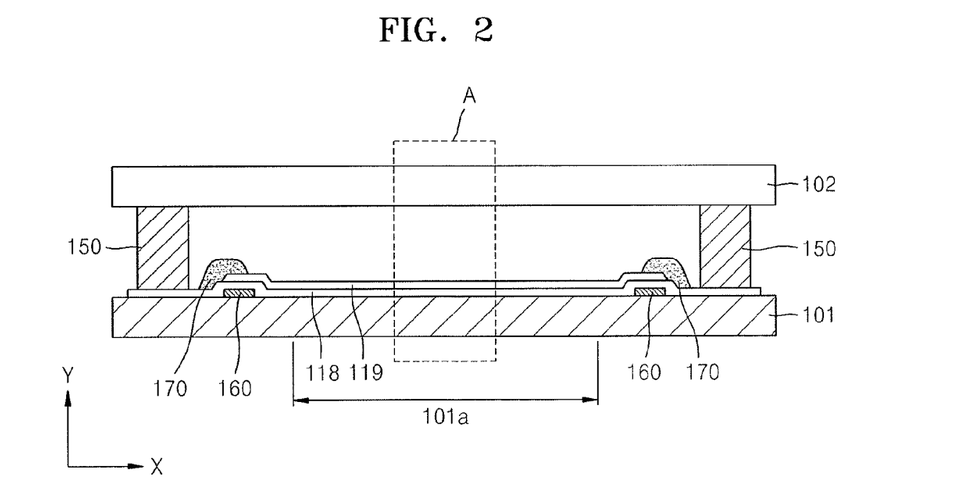
FIG. 2 illustrates a cross-sectional view taken along line II-II of FIG. 1.
Figure 3:
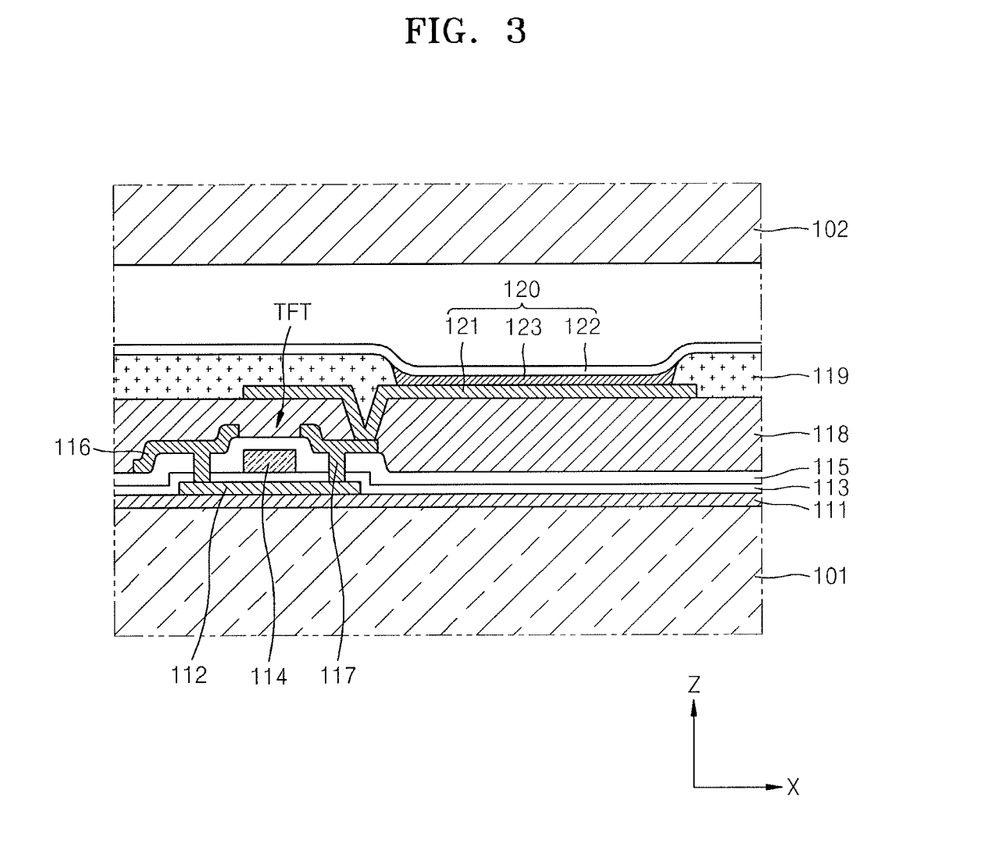
FIG. 3 illustrates an expanded view of a portion A of FIG. 2.

FIG. 1 illustrates a schematic plan view of an organic light-emitting display apparatus according to an exemplary embodiment, FIG. 2 illustrates a cross-sectional view taken along line II-II of FIG. 1, and FIG. 3 illustrates an expanded view of a portion A of FIG. 2.

Referring to FIGS. 1 to 3, the organic light-emitting display apparatus 100 includes a substrate 101, an encapsulation member 102, a thin film transistor TFT, an organic light-emitting device 120, a sealing member 150, an internal circuit unit 160, a passivation layer 118, a pixel defining layer 119, and a getter 170.

The thin film transistor TFT may include an active layer 112, a gate electrode 114, and source and drain electrodes 116 and 117. The organic light-emitting device 120 may include a first electrode 121, a second electrode 122, and an intermediate layer 123.

Each of the elements will be described in detail.

A display region 101a is formed on the substrate 101. A plurality of sub-pixels may be formed on the display region 101a, and each of the sub-pixels may include the organic light-emitting device 120 emitting visible light and at least one thin film transistor TFT connected to the organic light-emitting device 120.

A pad region 101b may be formed at one side of the substrate 101 to be spaced apart, e.g., along a horizontal direction, from the display region 101a. An integrated circuit (IC) chip such as a data driving unit and a plurality of pads may be mounted on the pad region 101b.

The substrate 101 may be a transparent glass substrate in which silicon dioxide ($SiO_2$) is used as a main component. However, embodiments are not limited thereto, e.g., a transparent plastic substrate may also be used. In this regard, plastic materials used to form the substrate 101 may include at least one of various organic materials.

The sealing member 150 may be disposed on the substrate 101 and may extend around the display region 101a. For example, the sealing member 150 may completely surround the display region 101a. The sealing member 150 may be formed of various materials and may join the substrate 101 with the encapsulation member 102.

The internal circuit unit 160 may be disposed between the display region 101a and the sealing member 150, e.g., the internal circuit unit 160 may completely surround the display region 101a. The sealing member 150 may completely surround the internal circuit unit 160. The internal circuit unit 160 may be, e.g., a scan driving unit or an emission control driving unit. The internal circuit unit 160 of FIG. 1 may surround all sides of the display region 101a, e.g., completely surround the display region 101a. However, embodiments are not limited thereto, e.g., the internal circuit unit 160 may be formed to correspond to one side of the display region 101a or to face two sides of the display region 101a.

The passivation layer 118 may be disposed on the thin film transistor TFT of the display region 101a and may extend so as to cover the internal circuit unit 160. In addition, the passivation layer 118 may be formed to be in contact with the sealing member 150. Accordingly, the binding force between the substrate 101 and the encapsulation member 102 may be increased. The passivation layer 118 includes, e.g., an inorganic material.

The pixel defining layer 119 may be formed on the passivation layer 118. The pixel defining layer 119 may overlap with a portion of the upper surface of the internal circuit unit 160. In addition, the pixel defining layer 119 may be in contact with the getter 170. The pixel defining layer 119 may include an organic material such as a polyimide-based polymer, an acrylic polymer, and/or an olefin-based polymer.

The pixel defining layer 119 may define a region where the intermediate layer 123 of the organic light-emitting device 120 is formed. This will be described later.

The getter 170 may be disposed between the substrate 101 and the encapsulation member 102. The getter 170 may reduce the possibility of and/or prevent external moisture and oxygen from damaging the organic light-emitting device 120, the thin film transistor TFT, and other thin films.

The getter 170 may react with moisture or oxygen existing in a space between the substrate 101 and the encapsulation member 102, resulting in efficiently removing the moisture and oxygen. As a result, the getter 170 reduces the possibility of and/or prevents moisture and oxygen from damaging the organic light-emitting device 120, the thin film transistor TFT, and other thin films.

The getter 170 includes at least one of Ba, Ca, Mg, Ti, V, Zr, Nb, Mo, Ta, Th, Ce, Al, and Ni. For example, the getter 170 may include an alloy or oxide including at least one material described above.

The getter 170 may overlap with at least one portion of the internal circuit unit 160. For example, the getter 170 may overhang the internal circuit unit 160 and portions of the passivation layer 118 and the pixel defining layer 119 on the internal circuit unit 160. The getter 170 includes, e.g., a metal or metal oxide as described above. If the getter 170 overlaps with, e.g., is directly on, the internal circuit unit 160, the material contained in the getter 170 may diffuse into the internal circuit unit 160, so that a short-circuit may be generated in the internal circuit unit 160 or other damages may be caused. According to an exemplary embodiment, however, since the passivation layer 118 covers the internal circuit unit 160, the material contained in the getter 170 may be fundamentally prevented from diffusing into the internal circuit unit 160. For example, when the passivation layer 118 includes an inorganic material, it may be difficult for the material contained in the getter 170 to diffuse into the passivation layer 118, so that the internal circuit unit 160 may be efficiently protected.

The display region 101a will be described in more detail with reference to FIG. 3. A buffer layer 111 may be formed on the substrate 101. The buffer layer 111 may include, e.g., $SiO_2$ and/or SiNx. The buffer layer 111 may provide a flat surface on the substrate 101 and may reduce the possibility of and/or prevent moisture and impurities from infiltrating into the substrate 101.

The active layer 112 may be formed on the buffer layer 111. The active layer 112 includes a semiconductor material, e.g., amorphous silicon or polycrystalline silicon.

A gate insulating layer 113 may be formed on the active layer 112, and the gate electrode 114 may be formed in a predetermined region of the gate insulating layer 113. The gate insulating layer 113 may insulate between the active layer 112 and the gate electrode 114 and may include an organic material or an inorganic material such as SiNx or $SiO_2$.

The gate electrode 114 may be formed of a metal such as Au, Ag, Cu, Ni, Pt, Pd, Al, and Mo, or an alloy of metal such as Al:Nd and Mo:W. However, embodiments are not limited thereto. The gate electrode 114 may be formed of various materials in consideration of, e.g., adhesion, surface smoothness, electrical resistance, and processibility. The gate electrode 114 may be connected to a gate line (not shown) that transmits an electrical signal.

An interlayer insulating layer 115 may be formed on the gate electrode 114. The interlayer insulating layer 115 and the gate insulating layer 113 may be formed to expose source and drain regions of the active layer 112, and source and drain electrodes 116 and 117 may be in contact with the exposed regions of the active layer 112.

The source and drain electrodes 116 and 117 may include a metal such as Au, Pd, Pt, Ni, Rh, Ru, Ir, and Os, or a metal alloy of Al and Mo, such as Al:Nd and MoW. However, embodiments are not limited thereto.

The passivation layer 118 may be formed to cover the source and drain electrodes 116 and 117. As described above, the passivation layer 118 may be an inorganic insulating layer that includes at least one of, e.g., $SiO_2$, SiNx, SiON, $Al_2O_3$, $TiO_2$, $Ta_2O_5$, $HfO_2$, $ZrO_2$, Barium Strontium Titanate (BST), and Lead Zirconate Titanate (PZT), and the like. However, the embodiments are not limited thereto, e.g., the passivation layer 118 may include various inorganic materials.

The passivation layer 118 may be formed to expose the drain electrode 117, and the organic light-emitting device 120 may be formed to be connected to the exposed drain electrode 117. The organic light-emitting device 120 may include the first electrode 121, the second electrode 122, and the intermediate layer 123. In particular, the first electrode 121 may be in contact with the drain electrode 117.

The intermediate layer 123 may include an organic emission layer that emits visible light when a voltage is applied between the first electrode 121 and the second electrode 122.

The pixel defining layer 119 may be formed on the first electrode 121 using, e.g., an insulating material. As described above, the pixel defining layer 119 may include an organic material. An opening may be formed in the pixel defining layer 119 to expose the first electrode 121. The intermediate layer 123 may be formed on the exposed first electrode 121. Then, the second electrode 122 may be formed to be connected to the intermediate layer 123.

The first electrode 121 and the second electrode 122 may have polarities of an anode and a cathode, respectively. The polarities of the first electrode 121 and the second electrode 122 may be reversed.

The encapsulation member 102 may be disposed on the second electrode 122. In the organic light-emitting display apparatus 100, according to an exemplary embodiment, the encapsulation member 102 may be disposed on the substrate 101. The substrate 101 and the encapsulation member 102 may be joined with each other by using the sealing member 150. This structure may reduce the possibility of and/or prevent the organic light-emitting device 120, the thin film transistor TFT, and other thin films from being damaged by, e.g., external impact, moisture, and oxygen.

The getter 170 may be disposed between the substrate 101 and the encapsulation member 102. The getter 170 may remove moisture and oxygen infiltrated into space between the substrate 101 and the encapsulation member 102 to efficiently protect the organic light-emitting device 120, the thin film transistor TFT, and other thin films from being damaged by the moisture and oxygen.

Further, the passivation layer 118 may extend to cover the internal circuit unit 160 when the passivation layer 118 covering the thin film transistor TFT is formed. In particular, the passivation layer 118 may include an inorganic material. Accordingly, even when the getter 170 overlaps the internal circuit unit 160, materials for forming the getter 170, e.g., a metal or metal oxide, may be fundamentally prevented from being infiltrated into the internal circuit unit 160 and damaging the internal circuit unit 160.

As a result, since the getter 170 may be formed not to be horizontally spaced apart from the internal circuit unit 160 but to overlap with, e.g., be above the internal circuit unit 160, as such, a space between the display region 101a and the sealing member 150 may be reduced. Thus, space on the substrate 101 of the organic light-emitting display apparatus 100 may be efficiently used.

In addition, the pixel defining layer 119 may be formed to overlap with the upper surface of the internal circuit unit 160, so that the possibility of damage of the internal circuit unit 160 may be efficiently reduced and/or prevented by the stacked structure of the passivation layer 118 and the pixel defining layer 119.

Further, the pixel defining layer 119 may be formed to contact with the getter 170, so that the infiltration of moisture and oxygen via the sides of the organic light-emitting display apparatus 100 may be efficiently reduced and/or prevented. That is, the getter 170, the pixel defining layer 119, and the passivation layer 118 may be sequentially aligned to function as barriers against moisture and oxygen.

Figure 4:
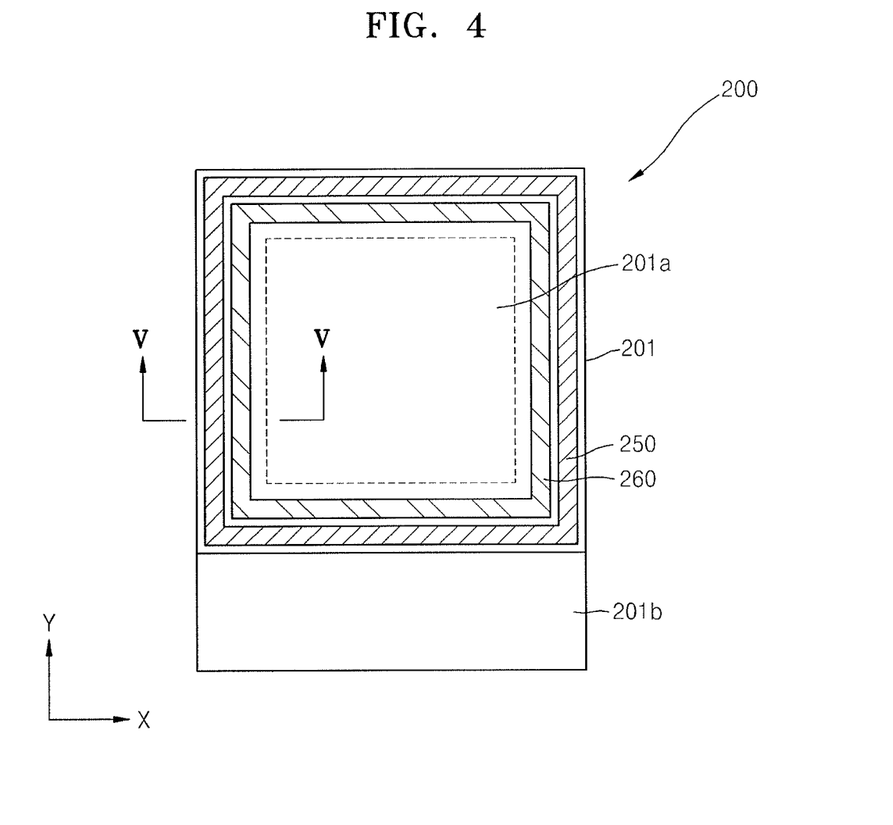
FIG. 4 illustrates a schematic plan view of an organic light-emitting display apparatus, according to an exemplary embodiment.
Figure 5:
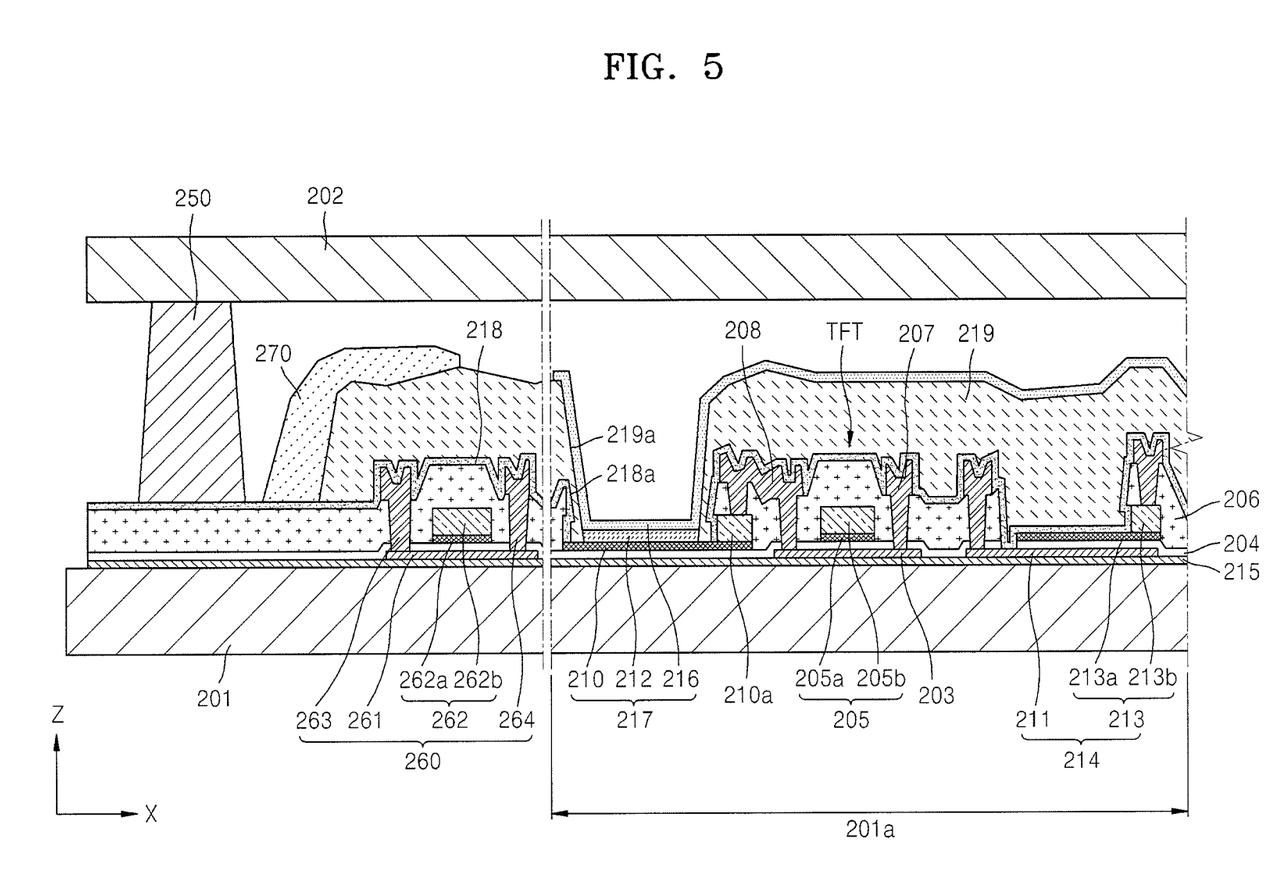
FIG. 5 illustrates a cross-sectional view taken along line V-V of FIG. 4.

FIG. 4 illustrates a schematic plan view of an organic light-emitting display apparatus according to another exemplary embodiment, and FIG. 5 illustrates a cross-sectional view taken along line V-V of FIG. 4.

Referring to FIGS. 4 to 5, the organic light-emitting display apparatus 200 includes a substrate 201, an encapsulation member 202, a thin film transistor TFT, an organic light-emitting device 217, a sealing member 250, an internal circuit unit 260, a passivation layer 218, a pixel defining layer 219, a getter 270, and a capacitor 214.

The thin film transistor TFT may include an active layer 203, a gate electrode 205, and source and drain electrodes 207 and 208. The organic light-emitting device 217 may include a first electrode 210, a second electrode 216, and an intermediate layer 212.

The substrate 201 may include a display region 201a. A plurality of sub-pixels may be formed on the display region 201a, and each of the sub-pixels may include an organic light-emitting device 217 emitting visible light and at least one thin film transistor TFT connected to the organic light-emitting device 217.

A pad region 201b is formed at one side of the substrate 201 to be spaced apart from the display region 201a. An integrated circuit (IC) chip such as a data driving unit and a plurality of pads may be mounted on the pad region 201b.

The sealing member 250 may be disposed around, e.g., completely surrounding, the display region 201a on the substrate 201. The sealing member 250 may be formed of various materials and may join the substrate 201 with the encapsulation member 202.

The internal circuit unit 260 may be disposed between the display region 201a and the sealing member 250. The internal circuit unit 260 may completely surround the display region 201a and the sealing member 250 may completely surround the internal circuit unit 260. The internal circuit unit 260 may be, e.g., a scan driving unit or an emission control driving unit. The internal circuit unit 260 of FIG. 4 may surround all sides of the display region 201a, but embodiments are not limited thereto. That is, the internal circuit unit 260 may be formed to correspond to one side of the display region 201a or to face two sides of the display region 201a.

The internal circuit unit 260 shown in FIG. 5 includes a circuit unit-active layer 261, a circuit unit-gate electrode 262, a circuit unit-source electrode 263, and a circuit unit-drain electrode 264. However, the internal circuit unit 260 is exemplified thereby, and the embodiments are not limited thereto. For example, the internal circuit unit 260 may also have various structures.

The passivation layer 218 may be disposed on the thin film transistor TFT of the display region 201a and may extend so as to cover the internal circuit unit 260. The passivation layer 218 may be formed to be in contact with the sealing member 250. The passivation layer 218 may include an inorganic material.

The pixel defining layer 219 may be formed on the passivation layer 218. The pixel defining layer 219 may define a region where the intermediate layer 212 of the organic light-emitting device 220 is formed.

The getter 270 is disposed between the substrate 201 and the encapsulation member 202. The getter 270 overlaps with at least one portion of the internal circuit unit 260. Materials used to form the getter 270 are described above, and thus a detailed description thereof will be omitted herein.

The display region 201a will be described in more detail with reference to FIG. 5. A buffer layer 215 may be formed on the substrate 201. The buffer layer 215 may correspond not only to the display region 201a but also to the sealing member 250.

An active layer 203 may be formed on the buffer layer 215. A first capacitor electrode 211 may be formed on the buffer layer 215. The first capacitor electrode 211 may be formed of the same material as the active layer 203. In addition, the circuit unit-active layer 261 may be formed on the buffer layer 215, e.g., the circuit-unit active layer 261 may be formed of the same material as the active layer 203.

A gate insulating layer 204 may be formed on the buffer layer 215 to cover the active layer 203 and the first capacitor electrode 211. The gate insulating layer 204 may also be formed to cover the display region 201a and the circuit unit-active layer 261 to correspond to a region including the sealing member 250.

The gate electrode 205, the first electrode 210, and the second capacitor electrode 213 may be formed on the gate insulating layer 204. The gate electrode 205 may include a first conductive layer 205a and a second conductive layer 205b. The first conductive layer 205a may include a transmissive conductive material, and examples of the transmissive conductive material include at least one of indium tin oxide (ITO), indium zinc oxide (IZO), zinc oxide (ZnO), indium oxide ($In_2O_3$), indium gallium oxide (IGO), and aluminum zinc oxide (AZO). The second conductive layer 205b may be formed on the first conductive layer 205a using a metal or an alloy of the metal, such as Mo, MoW, and an Al-based alloy, but embodiments are not limited thereto.

The first electrode 210 may include a transmissive conductive material and may be formed of the same material as the first conductive layer 205a. A conductive unit 210a may be disposed on a predetermined region of the first electrode 210 and may be formed of the same material as the second conductive layer 205b.

In addition, the first electrode 210 may have a multi-layered structure instead of a single-layered structure. A transmissive conductive layer may be formed on a semi-transmissive metal layer including metal such as Ag. That is, the first electrode 210 may have, e.g., an ITO/Ag structure. In this regard, at least one of IZO, ZnO, $In_2O_3$, IGO, and AZO may also be used instead of ITO.

The first electrode 210 may also have a triple-layered structure, e.g., an ITO/Ag/ITO structure. In this regard, at least one of IZO, ZnO, $In_2O_3$, IGO, and AZO may also be used instead of ITO.

Accordingly, visible light generated in the intermediate layer 212 may resonate between the first electrode 210 and the second electrode 216, thus, potentially resulting in improving light efficiency of the organic light-emitting display apparatus 200.

The first conductive layer 205a of the gate electrode 205 may also have a double-layered or triple-layered structure as the first electrode 210. The second capacitor electrode 213 may include a first layer 213a and a second layer 213b. The first layer 213a may be formed of the same material as the first conductive layer 205a, and the second layer 213b may be formed of the same material as the second conductive layer 205b. The first layer 213a may also have a double-layered or triple-layered structure as the first electrode 210.

The second layer 213b may be formed on the first layer 213a to have a smaller size than the first layer 213a. In addition, the second capacitor electrode 213 may overlap with the first capacitor electrode 211 to have a smaller size than the first capacitor electrode 211.

The circuit unit-gate electrode 262 of the internal circuit unit 260 may be formed on the gate insulating layer 204. The circuit unit-gate electrode 262 may include two layers 262a and 262b as the gate electrode 205, and the two layers 262a and 262b may be respectively formed of the same materials of the first and second conductive layers 205a and 205b of the gate electrode 205.

An interlayer insulating layer 206 may be formed on the first electrode 210, the gate electrode 205, and the second capacitor electrode 213. The interlayer insulating layer 206 may include various insulating materials such as organic materials or inorganic materials. The interlayer insulating layer 206 may be formed to correspond not only to the display region 201a but also to the sealing member 250 to cover the circuit unit-gate electrode 262.

Although not shown herein, the interlayer insulating layer 206 may have a multi-layered structure. For example, the interlayer insulating layer 206 may have a stacked structure including at least two layers, such as an inorganic/organic layer. Accordingly, insulating and protecting effects of the interlayer insulating layer 206 may be improved. In this regard, the inorganic layer constituting the interlayer insulating layer 206 may include, e.g., a silicon oxide or a silicon nitride.

If the interlayer insulating layer 206 has a multi-layered structure, the first electrode 210 may be formed on one of a plurality of insulating layers of the interlayer insulating layer 206 that is not the uppermost insulating layer.

Accordingly, the gate electrode 205 and the second capacitor electrode 213 may be formed on a different layer from a layer on which the first electrode 210 is formed. Thus, the first electrode 210 may not be damaged while forming the gate electrode 205 and the second capacitor electrode 213.

The source and the drain electrodes 207 and 208 may be formed on the interlayer insulating layer 206. The source and drain electrodes 207 and 208 may be formed to be connected to the active layer 203.

In addition, one of the source and drain electrodes 207 and 208 may be electrically connected to the first electrode 210. In FIG. 5, the drain electrode 208 may be electrically connected to the first electrode 210. In particular, the drain electrode 208 may be contacted with the conductive unit 210a.

The circuit unit-source electrode 263 and the circuit-unit drain electrode 264 may be formed on the interlayer insulating layer 206 to be connected to the circuit unit-active layer 261. The circuit unit-source electrode 263 and the circuit unit-drain electrode 264 may be respectively formed of the same material as the source electrode 207 or the drain electrode 208.

The passivation layer 218 may be formed on the interlayer insulating layer 206 to cover the thin film transistor TFT and capacitor 214. The passivation layer 218 may have an opening 218a corresponding to the upper surface of the first electrode 210. The passivation layer 218 may be formed on the circuit unit-source electrode 263 and the circuit unit-drain electrode 264. That is, the passivation layer 218 may be formed to cover the internal circuit unit 260. In addition, the passivation layer 218 may be formed to correspond to, e.g., be under, the sealing member 250.

The pixel defining layer 219 may be formed on the passivation layer 218. The pixel defining layer 219 may be formed to have an opening 219a corresponding to the upper surface of the first electrode 210, and the intermediate layer 212 may be formed on the first electrode 210 exposed via the opening 219a of the pixel defining layer 219. In more detail, the opening 219a of the pixel defining layer 219 may correspond to the opening 218a of the passivation layer 218 and may have a smaller size than the opening 218a of the passivation layer 218. Thus, the opening 218a of the passivation layer 218 may be covered with the pixel defining layer 219. As a result, the intermediate layer 212 may not be contact with the passivation layer 218 but may be in contact with the pixel defining layer 219.

The pixel defining layer 219 may include an organic material as described above. The pixel defining layer 219 may overlap with a portion of the upper surface of the internal circuit unit 260 and may be in contact with the getter 270.

The second electrode 216 may be formed on the intermediate layer 212. The encapsulation member 202 may be disposed on the second electrode 216.

In the organic light-emitting display apparatus 200 according to an exemplary embodiment, the encapsulation member 202 may be disposed on the substrate 201, and the substrate 201 and the encapsulation member 202 may be joined with each other by using the sealing member 250. This structure may reduce the possibility of and/or prevent the organic light-emitting device 217, the thin film transistor TFT, and other thin films from being damaged by, e.g., external impact, moisture, and oxygen.

In addition, the getter 270 may be disposed between the substrate 201 and the encapsulation member 202. The getter 270 may remove moisture and oxygen infiltrated into space between the substrate 201 and the encapsulation member 202 to efficiently prevent the organic light-emitting device 220, the thin film transistor TFT, and other thin films from being damaged by, e.g., the moisture and oxygen.

In addition, the passivation layer 218 may extend to cover the internal circuit unit 260 when the passivation layer 218 covering the thin film transistor TFT is formed. Accordingly, even when the getter 270 overlaps with the internal circuit unit 260, materials for forming the getter 270, e.g., a metal or metal oxide, may be fundamentally prevented from being infiltrated into the internal circuit unit 260 and damaging the internal circuit unit 260.

As a result, since the internal circuit unit 260 may be stably protected, and the getter 270 may be formed to overlap with the internal circuit unit 260, space between the display region 201a and the sealing member 250 may be reduced. In addition, since the gate electrode 205 and the capacitor 214 may be formed on the same layer using the same material, the thickness of the organic light-emitting display apparatus 200 may be efficiently reduced. Further, since the first electrode 210 may include a semi-transmissive metal layer, visible light generated in the intermediate layer 212 resonates between the first electrode 210 and the second electrode 216, which may improve light efficiency of the organic light-emitting display apparatus 200.

FIGS. 6A to 6F illustrate diagrams for sequentially depicting stages in a method of manufacturing an organic light-emitting display apparatus according to an exemplary embodiment. In particular, FIGS. 6A to 6F depict stages in a method of manufacturing the organic light-emitting display apparatus 200 shown in FIGS. 4 and 5.

Figure 6A:
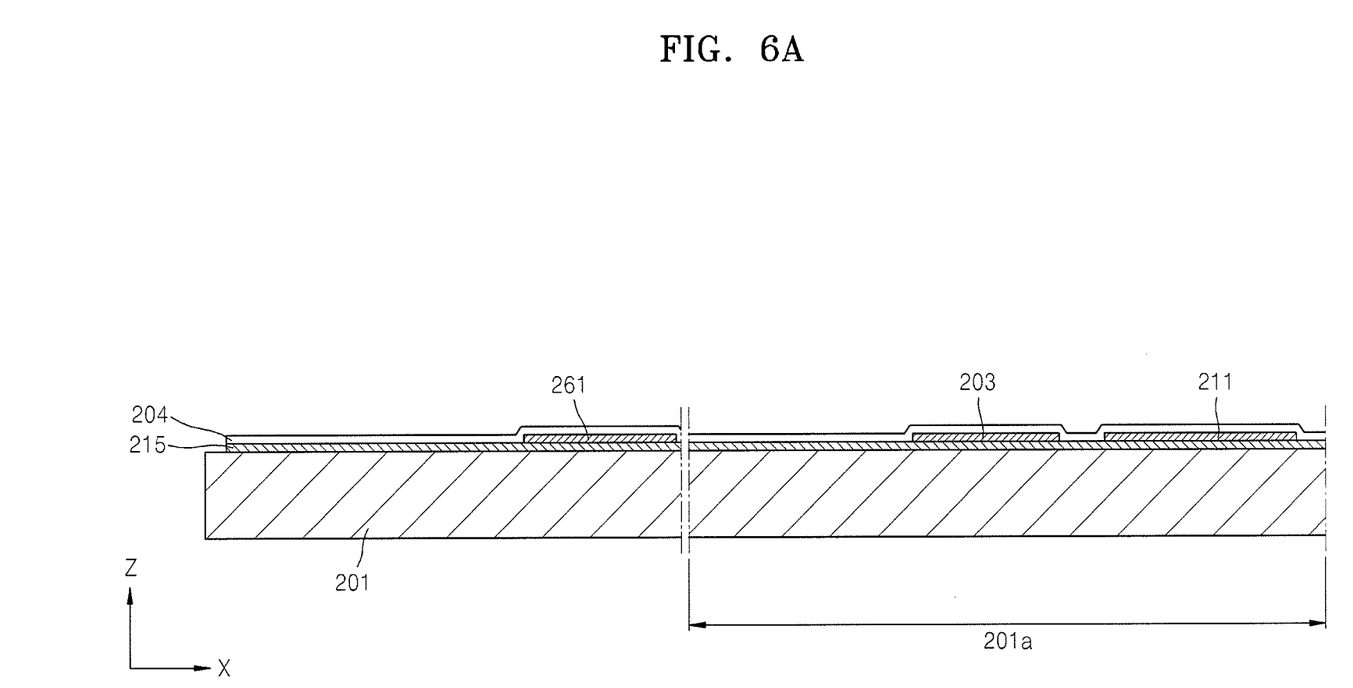
FIGS. 6A to 6F illustrate diagrams for sequentially depicting stages in a method of manufacturing an organic light-emitting display apparatus, according to an exemplary embodiment.

Referring to FIG. 6A, the buffer layer 215, the active layer 203, the first capacitor electrode 211, and the circuit unit-active layer 261 may be formed on the substrate 201. In more detail, the buffer layer 215 may be formed on the substrate 201, and the active layer 203 may be formed on the display region 201a to have a predetermined pattern, which is formed on the buffer layer 215. The first capacitor electrode 211 may be formed to be spaced apart, e.g., along a horizontal direction, from the active layer 203. The circuit unit-active layer 261 may be formed to be spaced apart, e.g., along the horizontal direction, from the display region 201a.

The gate insulating layer 204 may be formed on the buffer layer 215 to cover the active layer 203 and the first capacitor electrode 211. The gate insulating layer 204 may be formed to cover not only the display region 201a but also the circuit unit-active layer 261.

Figure 6B:
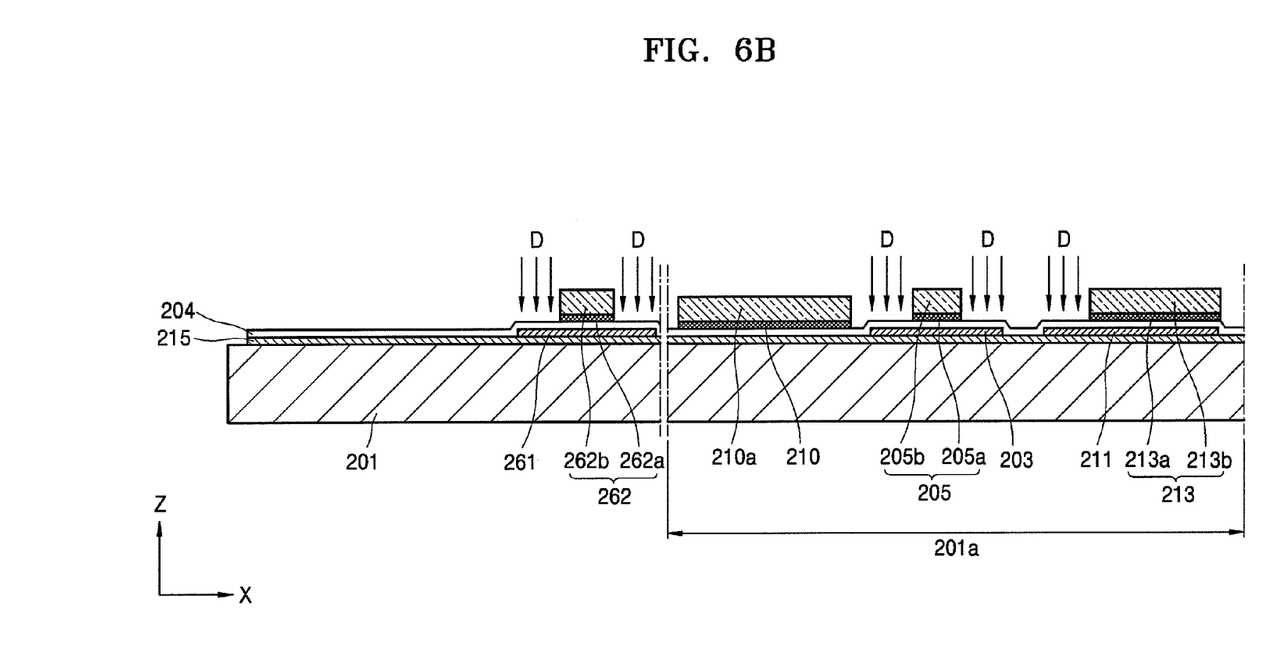

Then, referring to FIG. 6B, the gate electrode 205 including the first and second conductive layers 205a and 205b, the circuit unit-gate electrode 262 including the first and second layers 262a and 262b, and the second capacitor electrode 213 including the first and second layers 213a and 213b may be formed on the gate insulating layer 204. The first electrode 210 and the conductive unit 210a may also be formed.

Patterns of the gate electrode 205, the first electrode 210, and the conductive unit 210a may be simultaneously formed.

The first electrode 210, the first conductive layer 205a of the gate electrode 205, the first layer 213a of the second capacitor electrode 213, and the first layer 262a of the circuit unit-gate electrode 262 may include a transmissive conductive material. Examples of the transmissive conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO).

The first electrode 210, the first conductive layer 205a of the gate electrode 205, the first layer 213a of the second capacitor electrode 213, and the first layer 262a of the circuit unit-gate electrode 262 may have a multi-layered structure instead of a single-layered structure. A transmissive conductive layer may be formed on a semi-transmissive metal layer including metal such as Ag. For example, a conductive material layer may have an ITO/Ag structure. In this regard, at least one of IZO, ZnO, $In_2O_3$, IGO, and AZO may also be used instead of ITO.

The first electrode 210, the first conductive layer 205a of the gate electrode 205, the first layer 213a of the second capacitor electrode 213, and the first layer 262a of the circuit unit-gate electrode 262 may have a triple-layered structure, e.g., an ITO/Ag/ITO structure. In this regard, IZO, ZnO, $In_2O_3$, IGO, and AZO may be used instead of ITO.

Then, a dopant D may be injected in a direction shown with an arrow. The dopant may be a variety of elements, e.g., a Group 3 element such as boron (B) or a Group 5 element such as phosphorous (P).

Figure 6C:
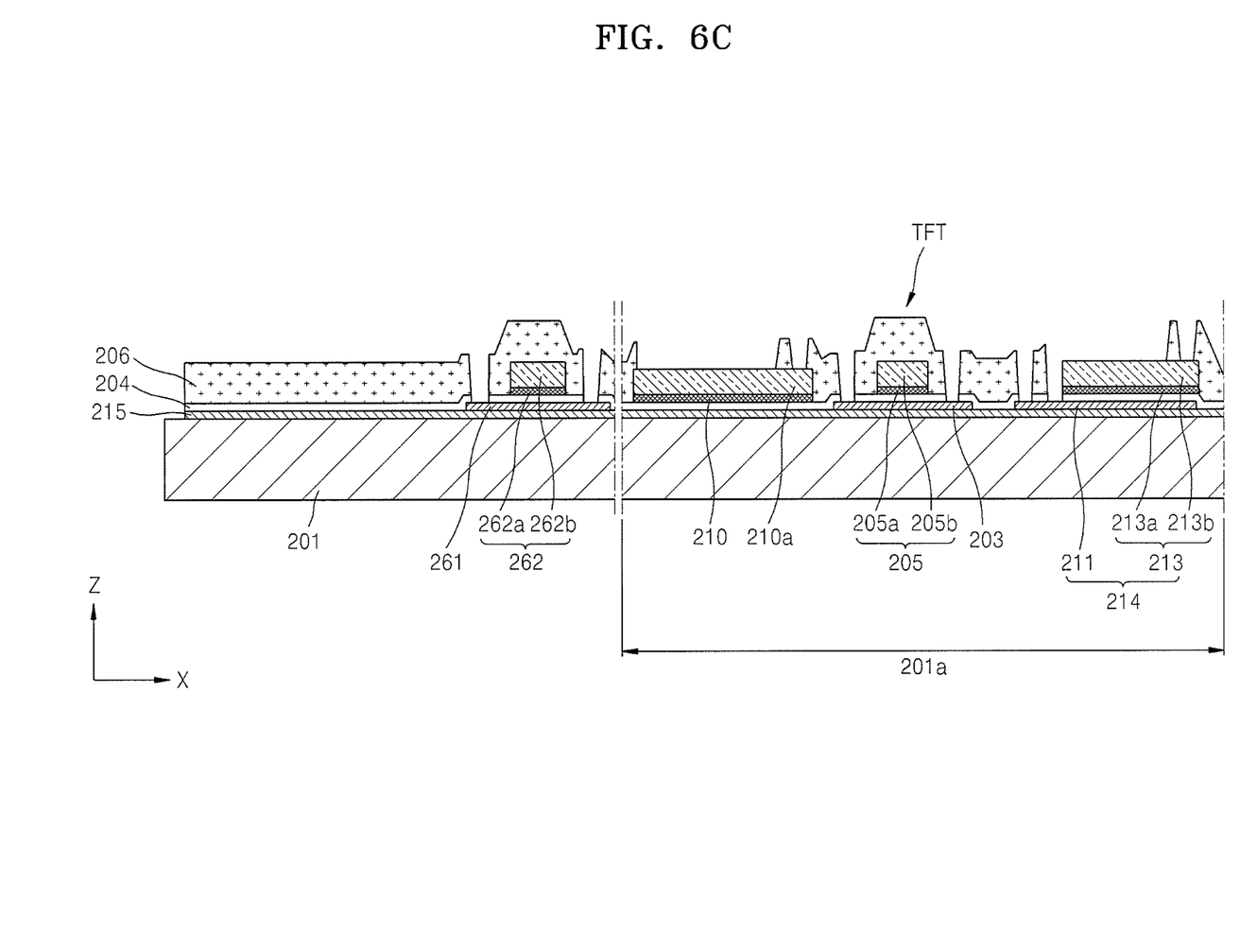

Then, referring to FIG. 6C, the interlayer insulating layer 206 may be formed on the conductive unit 210a, the gate electrode 205, and the second capacitor electrode 213. In this regard, an opening may be formed by removing a portion of the interlayer insulating layer 206 to correspond to a predetermined region of the conductive unit 210a. A portion of the interlayer insulating layer 206 may be removed to expose a predetermined region of the upper surface of the second layer 213b of the second capacitor electrode 213.

Portions of the interlayer insulating layer 206 and the gate insulating layer 204 may be removed to expose predetermined regions of the active layer 203, the circuit unit-active layer 261, and the first capacitor electrode 211.

Figure 6D:
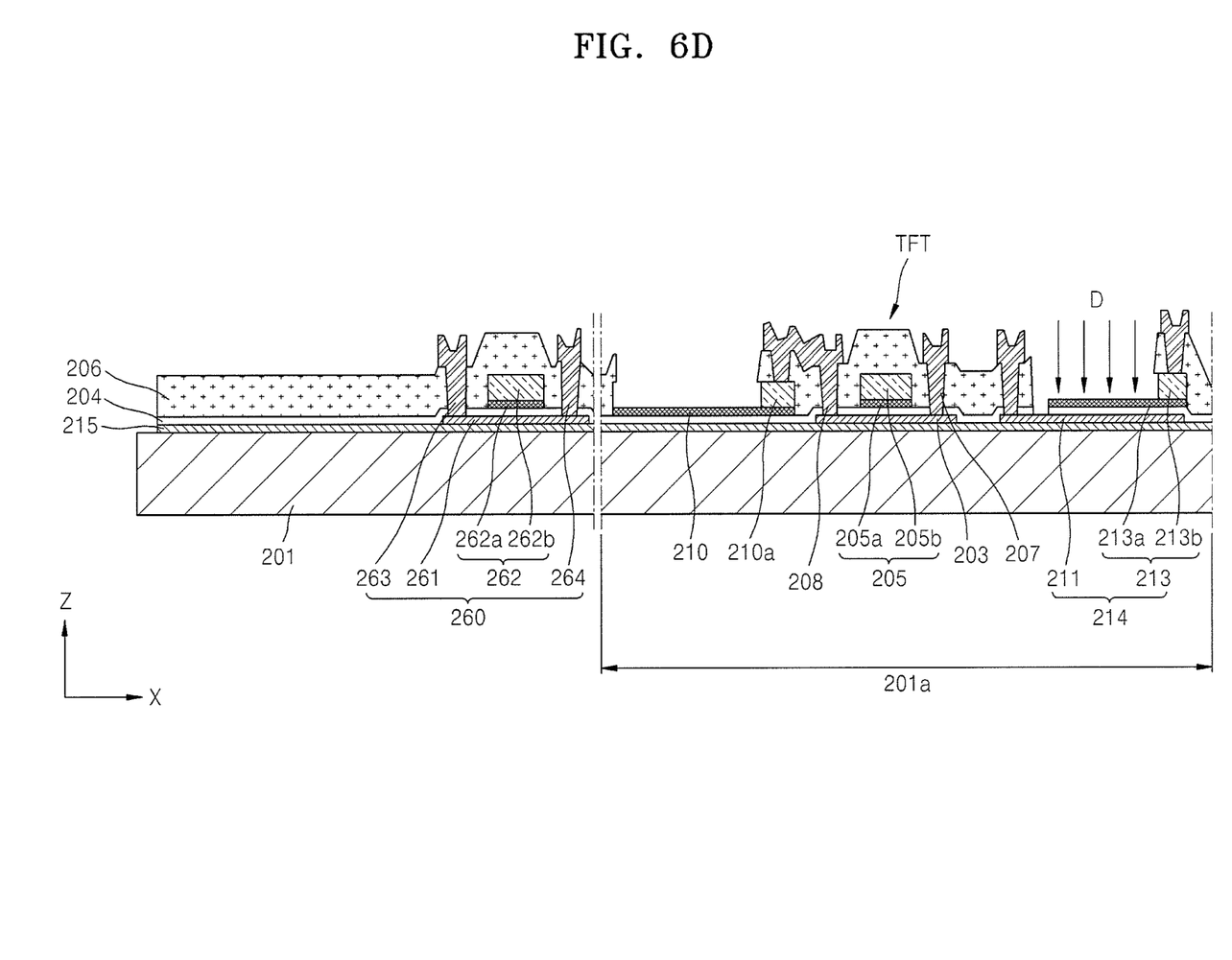

Then, referring to FIG. 6D, the region of the conductive unit 210a exposed via the opening of the interlayer insulating layer 206 may be removed to expose the first electrode 210. The region of the second layer 213b of the second capacitor electrode 213 exposed via the opening of the interlayer insulating layer 206 may be removed to expose the first layer 213a of the second capacitor electrode 213.

The source and drain electrodes 207 and 208 may be formed to be connected to the active layer 203, and the circuit unit-source electrode 263 and the circuit unit-drain electrode 264 may be formed to be connected to the circuit unit-active layer 261. Accordingly, the thin film transistor TFT and the internal circuit unit 260 may be prepared.

Then, the dopant D may be injected into the first capacitor electrode 211 in a direction shown with an arrow. That is, the dopant D may be injected into the first capacitor electrode 211 via the first layer 213a of the second capacitor electrode 213.

Figure 6E:
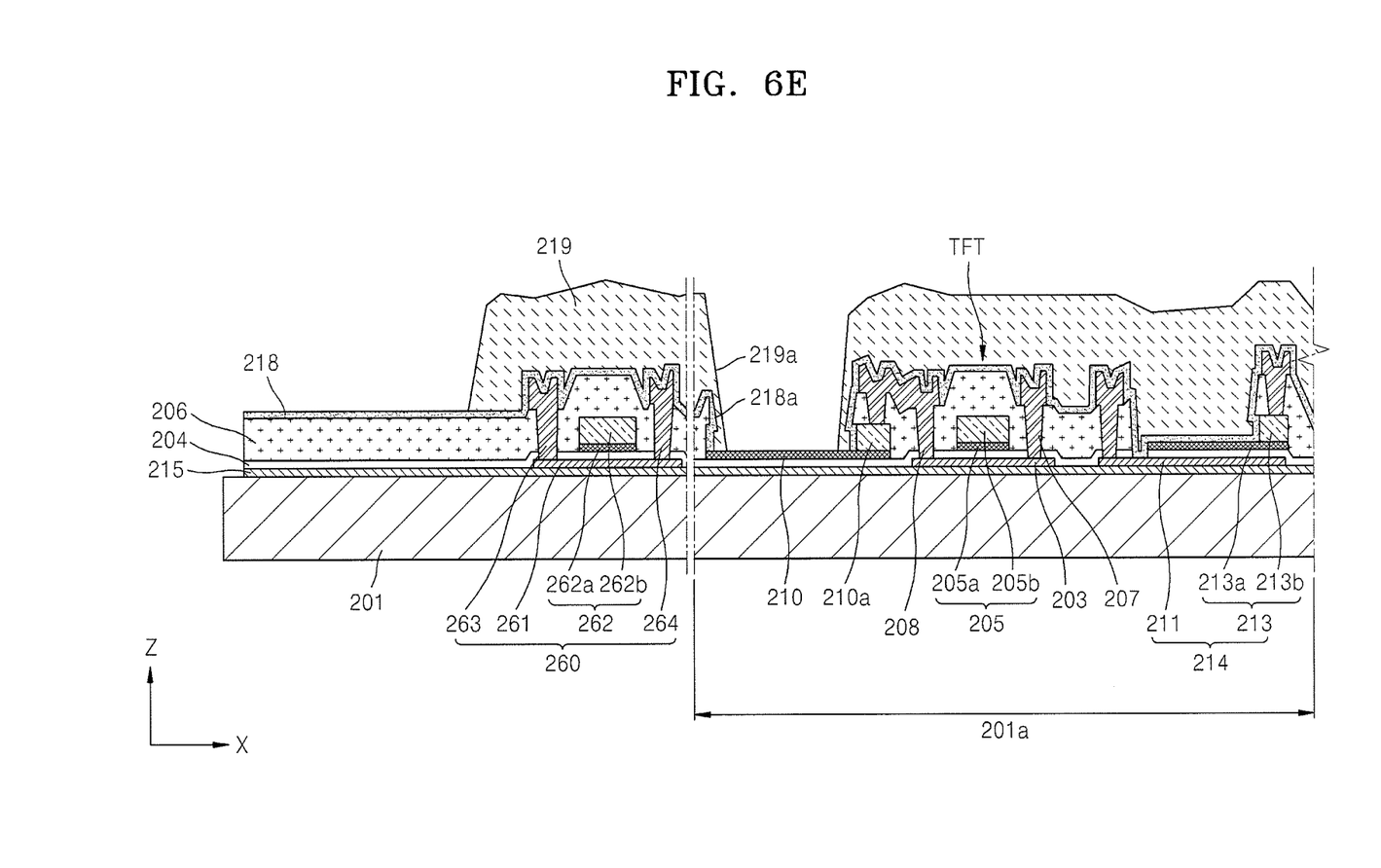

Then, referring to FIG. 6E, the passivation layer 218 may be formed on the interlayer insulating layer 206 to cover the thin film transistor TFT and the capacitor 214.

The passivation layer 218 may have an opening 218a corresponding to the upper surface of the first electrode 210. The passivation layer 218 may be formed on the circuit unit-source electrode 263 and the circuit unit-drain electrode 264. That is, the passivation layer 218 may be formed to cover the internal circuit unit 260.

The pixel defining layer 219 may be formed on the passivation layer 218. The pixel defining layer 219 may be formed to have an opening 219a corresponding to the upper surface of the first electrode 210, and the opening 219a of the pixel defining layer 219 may correspond to the opening 218a of the passivation layer 218 to have a smaller size than the opening 218a of the passivation layer 218. Thus, the opening 218a of the passivation layer 218 may be covered with the pixel defining layer 219.

The pixel defining layer 219 may overlap with a portion of the upper surface of the internal circuit unit 260.

The opening 218a of the passivation layer 218 may be formed using the opening 219a of the pixel defining layer 219 without using a separate mask. For example, a material for forming the passivation layer 218 and a material for forming the pixel defining layer 219 may be sequentially stacked. Then, the material for forming the pixel defining layer 219 may be patterned to form the opening 219a of the pixel defining layer 219. Then, the material for forming the passivation layer 218 may be etched via the opening 219a of the pixel defining layer 219 to form the opening 218a of the passivation layer 218. In this regard, the passivation layer 218 may be partially exposed via the opening 219a of the pixel defining layer 219. A portion of the pixel defining layer 219 may be melted by heat-treatment to flow into the opening 218a of the passivation layer 218, so that the opening 218a of the passivation layer 218 may be covered with the pixel defining layer 219, and the passivation layer 218 may not be exposed by the opening 219a of the pixel defining layer 219.

That is, as shown in FIG. 6E, the size of the opening 219a of the pixel defining layer 219 is smaller than that of the opening 218a of the passivation layer 218 corresponding to the first electrode 210, and the opening 218a of the passivation layer 218 may be spaced apart from the opening 219a of the pixel defining layer 219.

Figure 6F:
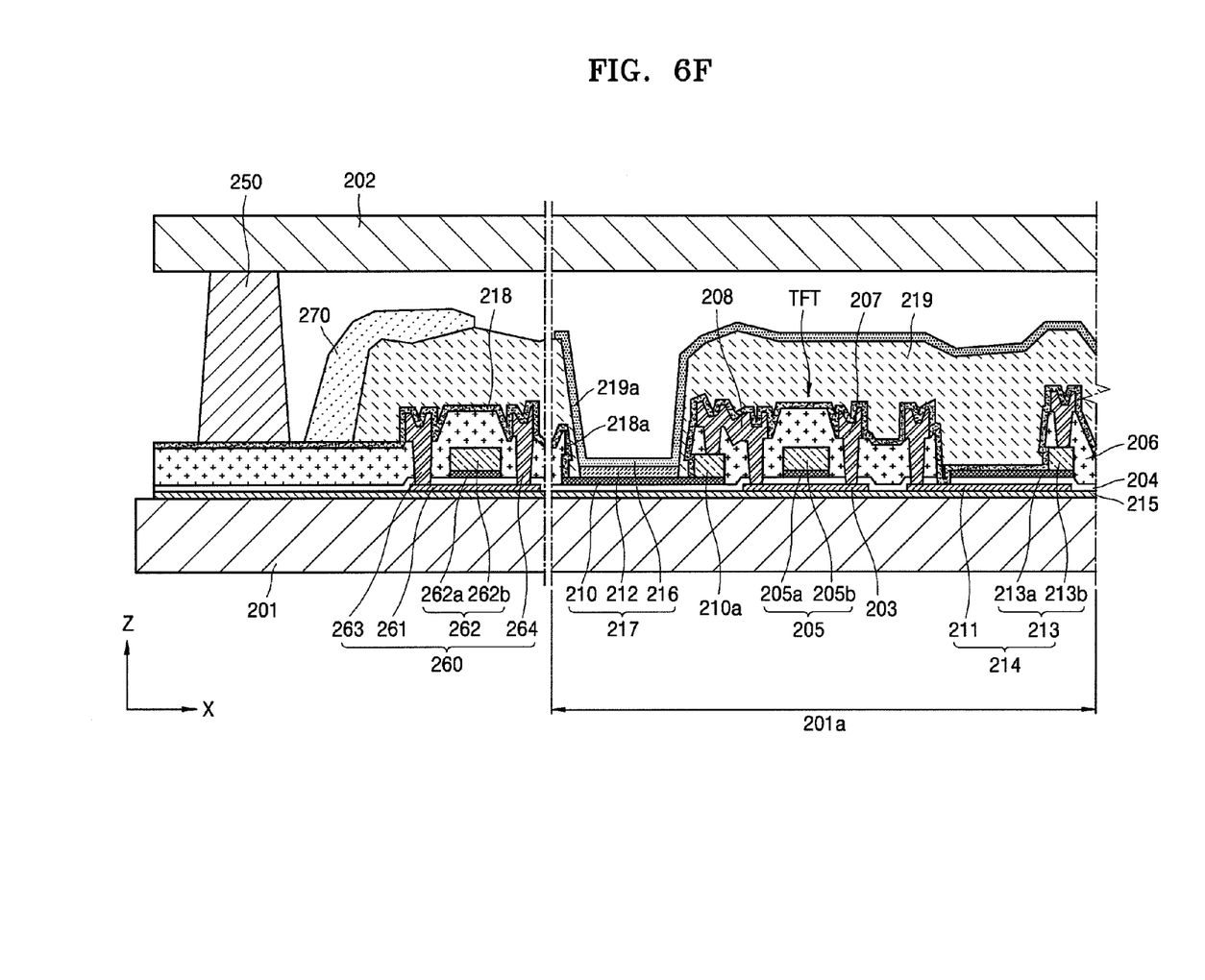

Then, referring to FIG. 6F, the intermediate layer 212 may be formed on the first electrode 210, and the second electrode 216 may be formed on the intermediate layer 212 to prepare the organic light-emitting device 217.

The sealing member 250 may be disposed around the display region 201a on the substrate 201. The encapsulation member 202 may be disposed to face the substrate 201, and the substrate 201 and the encapsulation member 202 may be joined with each other by using the sealing member 250.

The getter 270 may be disposed between the substrate 201 and the encapsulation member 202. The getter 270 may overlap with at least one portion of the internal circuit unit 160. The getter 270 may be formed on the passivation layer 218. The getter 270 may be formed to be in contact with the pixel defining layer 219.

As described above, according to the one or more of the above exemplary embodiments, the organic light-emitting display apparatus may have excellent durability and high spatial availability on the substrate.

By way of summation and review, from among the flat panel devices, an organic light-emitting display apparatus, which is a self-emissive display apparatus, has a wide viewing angle, high contrast ratio, and high response speed, and thus has been considered as the next-generation display apparatus. An organic light-emitting display apparatus may include a first electrode, a second electrode, and an intermediate layer. The intermediate layer includes an organic emission layer that emits visible light when a voltage is applied to the first and second electrodes. The organic light-emitting display apparatus includes a plurality of pixels and a circuit unit that drives the pixels. A plurality of thin films and the circuit unit constituting the organic light-emitting display apparatus may be vulnerable to external moisture and oxygen. Thus, durability of the organic light-emitting display apparatus may be deteriorated.

In contrast, embodiments, e.g., the exemplary embodiments discussed above, relate to an organic light-emitting display apparatus having excellent durability and high spatial availability on a substrate and a method of manufacturing the organic light-emitting display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate that includes a display region;
   an encapsulation member facing the substrate;
   a thin film transistor on the display region of the substrate, the thin film transistor facing the encapsulation member and including an active layer, a gate electrode, and source and drain electrodes;
   an organic light-emitting device on the display region, the organic light-emitting device being electrically connected to the thin film transistor and including a first electrode, a second electrode, and an intermediate layer interposed between the first and second electrodes, and the intermediate layer including an organic emission layer;
   a sealing member between the substrate and the encapsulation member, the sealing member surrounding the display region;
   an internal circuit unit between the display region and the sealing member;
   a passivation layer on the thin film transistor and extending to cover the internal circuit unit;
   a pixel defining layer on the passivation layer; and
   a getter between the substrate and the encapsulation member, the getter at least partially overlapping a top surface of the internal circuit unit, the getter being not directly connected to the second electrode and spaced apart from the sealing member,
   wherein the getter is over and directly contacts the pixel defining layer, at least a portion of the pixel defining layer being formed between the passivation layer and the getter, a portion of the getter being between the sealing member and the pixel defining layer, the portion of the getter between the sealing member and the pixel defining layer directly contacting the pixel defining layer, and the getter includes a material that reacts with moisture or oxygen infiltrated into a space between the substrate and the encapsulation member.

2. The organic light-emitting display apparatus of claim 1, wherein the passivation layer includes an inorganic material.

3. The organic light-emitting display apparatus of claim 1, wherein the getter is on the passivation layer, the passivation layer completely covering the top surface of the internal circuit unit.

4. The organic light-emitting display apparatus of claim 3, wherein the getter is further between the sealing member and the display region, the getter at least partially overlapping a top surface of the pixel defining layer that faces away from the internal circuit unit.

5. The organic light-emitting display apparatus of claim 3, wherein the getter continuously extends from a top surface of the passivation layer to a top surface of the pixel defining layer along an edge of the pixel defining layer, the getter being in contact with the pixel defining layer.

6. The organic light-emitting display apparatus of claim 1, wherein the pixel defining layer includes an organic material and a portion of an upper surface of the pixel defining layer is exposed via an opening between the getter and the second electrode.

7. The organic light-emitting display apparatus of claim 1, wherein
   the intermediate layer is spaced apart from the passivation layer and is in contact with the pixel defining layer.

8. The organic light-emitting display apparatus of claim 1, further comprising:
   a gate insulating layer between the active layer and the gate electrode, and
   an interlayer insulating layer on the gate electrode, the source and drain electrodes being on the interlayer insulating layer.

9. The organic light-emitting display apparatus of claim 8, wherein the first electrode is on the gate insulating layer.

10. The organic light-emitting display apparatus of claim 8, wherein the interlayer insulating layer has a stacked structure including at least two insulating layers.

11. The organic light-emitting display apparatus of claim 10, wherein the interlayer insulating layer includes an inorganic material and an organic material alternately stacked therein.

12. The organic light-emitting display apparatus of claim 10, wherein the first electrode on one of a plurality of insulating layers that is not an uppermost insulating layer.

13. The organic light-emitting display apparatus of claim 1, further comprising a capacitor on the substrate, wherein the capacitor includes:
   a first capacitor electrode on a same layer as the active layer and including a same material as the active layer, and
   a second capacitor electrode on a same layer as the gate electrode and including a same material as the first electrode.

14. The organic light-emitting display apparatus of claim 13, wherein the second capacitor electrode has a smaller size than the first capacitor electrode.

15. The organic light-emitting display apparatus of claim 1, wherein the first electrode includes a transmissive conductive material.

16. The organic light-emitting display apparatus of claim 15, wherein the transmissive conductive material includes at least one of indium tin oxide, indium zinc oxide, zinc oxide, indium oxide, indium gallium oxide, or aluminum zinc oxide.

17. The organic light-emitting display apparatus of claim 1, wherein the first electrode includes a transmissive conductive material on a semi-transmissive metal layer.

18. The organic light-emitting display apparatus of claim 17, wherein the first electrode includes a second transmissive conductive material under the semi-transmissive metal layer.

19. The organic light-emitting display apparatus of claim 17, wherein the semi-transmissive metal layer includes Ag.

20. The organic light-emitting display apparatus of claim 1, wherein the intermediate layer is in a non-overlapping relationship with the thin film transistor and is spaced apart from the thin film transistor.

21. An organic light-emitting display apparatus, comprising:
   a substrate that includes a display region;
   an encapsulation member facing the substrate;
   a thin film transistor on the display region of the substrate, the thin film transistor facing the encapsulation member and including an active layer, a gate electrode, and source and drain electrodes;
   an organic light-emitting device on the display region, the organic light-emitting device being electrically connected to the thin film transistor and including a first electrode, a second electrode, and an intermediate layer interposed between the first and second electrodes, and the intermediate layer including an organic emission layer;

a sealing member between the substrate and the encapsulation member, the sealing member surrounding the display region;

an internal circuit unit between the display region and the sealing member;

a passivation layer on the thin film transistor and extending to cover the internal circuit unit;

a pixel defining layer on the passivation layer; and a getter between the substrate and the encapsulation member, the getter at least partially overlapping the internal circuit unit, wherein the getter is over and directly contacts the pixel defining layer, a portion of the getter is between the sealing member and the pixel defining layer, the portion of the getter between the sealing member and the pixel defining layer directly contacting the pixel defining layer, and the getter includes a material that reacts with moisture or oxygen infiltrated into a space between the substrate and the encapsulation member, the material including at least one of Ca, Mg, V, Zr, Nb, Ta, Th, Ce, or Ni, or an oxide including at least one of Ca, Mg, Ti, V, Zr, Nb, Mo, Ta, Th, Ce, Al, or Ni.

22. A method of manufacturing an organic light-emitting display apparatus, the method comprising:

forming a thin film transistor that includes an active layer, a gate electrode, and source and drain electrodes on a display region of a substrate;

forming an organic light-emitting device on the display region, the organic light-emitting device being electrically connected to the thin film transistor and including a first electrode, a second electrode, and an intermediate layer interposed between the first and second electrodes, and the intermediate layer including an organic emission layer;

forming a sealing member between the substrate and an encapsulation member, the sealing member surrounding the display region, and the thin film transistor being between the substrate and the encapsulation member;

forming an internal circuit unit between the display region and the sealing member;

forming a passivation layer on the thin film transistor, the passivation layer extending to cover the internal circuit unit;

forming a pixel defining layer on the passivation layer; and forming a getter that at least partially overlaps a top surface of the internal circuit unit, is not directly connected to the second electrode, and is spaced apart from the sealing member, wherein the getter is over and directly contacts the pixel defining layer, at least a portion of the pixel defining layer being formed between the passivation layer and the getter, a portion of the getter being between the sealing member and the pixel defining layer, the portion of the getter between the sealing member and the pixel defining layer directly contacting the pixel defining layer, and the getter includes a material that reacts with moisture or oxygen infiltrated into a space between the substrate and the encapsulation member.

23. The method of claim 22, wherein the passivation layer and the pixel defining layer, respectively, have formed therein an opening corresponding to an upper surface of the first electrode, the opening of the passivation layer being formed after the opening of the pixel defining layer is formed.

24. The method of claim 23, wherein edges of the opening of the passivation layer are covered by the pixel defining layer.

* * * * *